(12) United States Patent
Higdon et al.

(10) Patent No.: US 6,281,106 B1
(45) Date of Patent: Aug. 28, 2001

(54) METHOD OF SOLDER BUMPING A CIRCUIT COMPONENT

(75) Inventors: William David Higdon, Greentown; Frank Stepniak, Noblesville; Shing Yeh, Kokomo, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/449,820

(22) Filed: Nov. 25, 1999

(51) Int. Cl.$^7$ .................................................. H01L 21/44
(52) U.S. Cl. ........................ 438/613; 438/612; 438/614
(58) Field of Search .................................. 438/612, 613, 438/614, 615, 660

(56) References Cited

U.S. PATENT DOCUMENTS 5,470,787   11/1995   Greer .................................... 437/183
5,872,404 * 2/1999   Lynch et al. .

* cited by examiner

Primary Examiner—Caridad Everhart
(74) Attorney, Agent, or Firm—Jimmy L. Funke

(57) ABSTRACT

A method for solder bumping a surface-mount circuit component, as well as electrically and mechanically connecting the component to a conductor on a substrate, and the components and assemblies formed thereby. The method generally entails forming a multilayer metal bump containing discrete layers, including at least one layer of a solder alloy, a first metallic layer having a sufficiently high melting point so as not to melt or deform at the reflow temperature of the solder alloy, and a second metallic layer containing at least one metal that is soluble in the solder alloy. During reflow, the first metallic layer does not collapse, while the solder layer and the second metallic layer readily flow and subsequently bond the first metallic layer to suitable structures on the component and substrate. As a result of the reflow operation, the multilayer metal bump of this invention forms a solder connection with a graded composition, namely, an intermediate region formed primarily by the first metallic layer, and at least one end region that contains a solid solution formed of the solder layer and the first and second metallic layers.

21 Claims, 1 Drawing Sheet

METHOD OF SOLDER BUMPING A CIRCUIT COMPONENT

TECHNICAL FIELD

The present invention generally relates to circuit components and particularly surface-mount (SM) circuit devices. More particularly, this invention relates to a method of solder bumping a circuit component to yield a graded solder connection with improved standoff.

BACKGROUND OF THE INVENTION

Surface-mount (SM) semiconductor devices such as flip chips typically include an integrated circuit and beadlike terminals formed on one of their surfaces. The terminals are typically in the form of solder bumps near the edges of the chip, and serve to both secure the chip to a circuit board and electrically interconnect the flip chip circuitry to a conductor pattern on the circuit board. The circuit board may be a ceramic substrate, printed wiring board (PWB), flexible circuit or silicon substrate, though other substrates are possible. Due to the numerous functions typically performed by the microcircuitry of a semiconductor device, a relatively large number of solder bumps are required. The size of a typical flip chip is generally on the order of a few millimeters per side, resulting in the solder bumps being crowded along the edges of the chip.

Because of the narrow spacing required for the solder bumps and their conductors, soldering a flip chip or other SM component to a conductor pattern requires a significant degree of precision. Reflow solder techniques are widely employed for this purpose, and entail precisely depositing a controlled quantity of solder on the interconnect pads of the chip using methods such as electrodeposition and printing. Once deposited, heating the solder above its melting or liquidus temperature serves to form the solder bumps on the pads. After cooling to solidify the solder bumps, the chip is soldered to the conductor pattern by registering the solder bumps with their respective conductors and then reheating, or reflowing, the solder so as to form solder connections that metallurgically adhere to the conductors.

Flip chip interconnect pads are electrically interconnected with the circuitry on the flip chip through vias. Because aluminum metallization is typically used in the fabrication of integrated circuits, interconnect pads are typically aluminum or aluminum alloy, which are generally unsolderable and susceptible to corrosion if left exposed. Consequently, one or more additional metal layers are often deposited on aluminum interconnect pads to promote wetting and metallurgical bonding with solder bump alloys. These additional metal layers, or under bump metallurgy (UBM), may be, for example, electroless nickel and a top layer of gold that will readily wet and bond with typical tin-lead solder alloys. Another suitable UBM composition has a multilayer structure that includes an adhesion-promoting layer, a diffusion barrier layer, and a solderable layer. The adhesion layer may be aluminum or another metal composition that will bond to the underlying aluminum interconnect pad. Copper is readily solderable, i.e., can be wetted by and will metallurgically bond with solder alloys of the type used for solder bumps, and therefore is a common choice for the solderable (top) layer of the UBM. The diffusion barrier layer is typically a nickel-vanadium or chromium-copper alloy, and is disposed between the adhesion and solderable layers to inhibit diffusion between the solder and aluminum pad. A NiV and CrCu layer also serves as a wettable layer if an overlaying copper layer is dissolved into the solder.

FIG. 1 depicts a prior art surface-mount assembly, in which an interconnect pad 112 of a flip chip 110 is electrically and mechanically connected with a solder connection 114 to a conductor 116 on a substrate 118. As shown, the assembly includes a UBM 120 deposited within an opening in a passivation layer 122 formed on the surface of the chip 110 to provide protection from environmental contaminants, moisture and electrical shorts. The solder connection 114 has a shape slightly wider than spherical, characteristic of a reflowed solder bump of any alloy, such as the eutectic 63Sn/37Pb solder alloy (melting point of 183° C.) and near-eutectic Sn-Pb solder alloys widely used for flip chip assemblies. As used herein, a near-eutectic alloy has physical and mechanical properties very near that of the eutectic alloy.

Placement of the chip and reflow of the solder must be precisely controlled not only to coincide with the spacing of the interconnect pads and the conductors to which the solder bumps are registered and reflow soldered, but also to control the height and width of the solder connections after reflow. As would be expected, controlling the width of the solder connections is necessary to prevent shorting between adjacent connections. As is also well known in the art, controlling the height of solder connections after reflow is often necessary to prevent the molten solder from drawing the flip chip excessively close to the substrate during the reflow operation, when the molten solder bump tends to spread outward as a result of wetting the surfaces it contacts. Sufficient spacing between the chip and its substrate, often termed the "standoff," is desirable for enabling stress relief during thermal cycles, allowing penetration of cleaning solutions for removing undesirable processing residues, and enabling the penetration of mechanical bonding and underfill materials between the chip and certain substrate materials.

Control of solder bump height and width are determined in part by the amount and composition of the solder deposited on the interconnect pads of a flip chip. The amount of solder can be closely controlled by known deposition methods. However, as evident from FIG. 1, as solders are reflowed they tend to collapse, forming spherically-shaped solder connections 120 with limited standoff. The standoff possible with a reflowed solder bump is also reduced by the tendency for the solder to flow out over the conductors during reflow, reducing the volume of solder directly between the interconnect pad and substrate. High melting point (MP) solders have been used on die to improve standoff following die assembly by solder reflow. Before assembly, a relatively high MP solder is reflowed on the die, and a lower MP solder is applied to the substrate to which the die is to be attached. For the assembly operation, a reflow temperature is chosen such that the low MP solder reflows to join the high MP solder (and therefore, the die) to the substrate, but the high MP solder does not melt and collapse. As a result, the high MP solder is able to substantially maintain the pre-reflow standoff of the assembly. However, there is a cost disadvantage to placing solder on the substrate prior to assembly, especially for devices with pad pitches of 250 micrometers and less.

From the above it can be seen that it would be desirable if an improved method were available for forming solder bumps on flip chips and other SM semiconductor devices that employ solder bumps, by which such devices could be reflow soldered to yield solder connections of a more columnar nature and with greater standoff while also being compatible with typical process temperature constraints of SM processes.

SUMMARY OF THE INVENTION

According to this invention, a method is provided for solder bumping a SM circuit component, as well as electrically and mechanically connecting the component to a conductor on a substrate, and the components and assemblies formed thereby. The method of this invention promotes the formation of solder connections with sufficient height to enable stress relief during thermal cycles, allow penetration of cleaning solutions beneath the circuit component, and enable the penetration of mechanical bonding and underfill materials between the component and substrate, while also being compatible with process temperature limitations that typically exist for surface-mount devices and substrate materials.

The method generally entails forming a multilayer metal bump containing discrete layers, including at least one layer of a solder alloy, a first metallic layer having a sufficiently high melting point so as not to melt or deform at the reflow temperature of the solder alloy, and a second metallic layer containing at least one metal that is soluble in the solder alloy. During reflow, the first metallic layer does not collapse, while the solder layer dissolves the second metallic layer and subsequently bonds the first metallic layer to suitable structures on the component and substrate. As a result of the reflow operation, the multilayer metal bump of this invention forms a solder connection with a graded composition, namely, an intermediate region formed primarily by the first metallic layer, and at least one end region that contains a solid solution formed of the solder layer and the first and second metallic layers.

A multilayer metal bump in accordance with this invention is formed on a suitable interconnect surface on a circuit component. If the first metallic layer is formed of a solder alloy, a solderable interconnect surface is preferred. A solderable interconnect surface can be formed by either a solderable interconnect pad or a solderable metallic layer deposited on a nonsolderable interconnect pad. To deposit the bump metals by electroplating, a plating seed layer may be deposited on the interconnect surface. A mask is formed over the component surface, and a via is defined in the mask to expose a portion of the plating seed layer if present, or otherwise a portion of the interconnect surface. An optional solder layer having a melting temperature less than the first metallic layer may be deposited on the exposed portion to improve the adhesion between the interconnect surface and subsequent bump metals. The first metallic layer, second metallic layer, and solder layer are then sequentially deposited in the via.

After removal of the mask (and typically after subsequent wafer fabrication processes, test and die singulation), the component is electrically and mechanically connected to a conductor on a substrate by first registering the solder layer with the conductor, and then heating the component and substrate to melt the solder layer (as well as the optional solder layer, if present). During heating (reflow), the solder layer dissolves and forms intermetallics with the second metallic layer, yielding an end region of the solder connection that bonds the first metallic layer to the conductor. If present, the optional solder layer dissolves and forms intermetallics with the plating seed layer, yielding a second end region that bonds the first metallic layer to the interconnect surface. Continued heating of the component and substrate causes limited mixing between the solder layers and the adjacent portions of the first metallic layer. A single temperature excursion (reflow) can be employed to form the solder connection, though a longer excursion and/or multiple excursions may be desirable depending on the particular compositions of the bump metals. On cooling, a graded solder connection is formed that electrically and mechanically connects the component to the conductor.

According to a preferred aspect of this invention, the intermediate region is primarily composed of the composition of the first metallic layer, with the end regions making the transition from the intermediate region to the surfaces of the interconnect surface and conductor. The composition of the first end region will be a solid solution composed primarily of the material of the solder layer with lesser amounts of material from the first metallic layer. If the optional solder layer is used, the composition of the second end region will be a solid solution composed primarily of the material of the optional solder layer with lesser amounts of material from the first metallic layer. The graded solder connection is essentially free of the original solder alloy of the solder layer and optional solder layer, which would undesirably promote the spherical-shaped solder connection depicted in FIG. 1.

The result of the above process is a surface-mount component whose standoff above the substrate is determined in large part by the first metallic layer of the multilayer metal bump, which forms the intermediate region of the connection. Because the first metal layer does not melt during reflow, the bulk of the intermediate region does not collapse during reflow, and retains the composition of the first metallic layer.

Alloys of various metals can be used to form the solder layers. The first metallic layer can be formed of a single metal, or an alloy containing metals different from the solder layers. In a preferred embodiment, the solder layers are composed of tin and lead near the eutectic ratio of 63 and 37 weight percent, respectively, and the first metallic layer is a tin-lead alloy of at least 80 weight percent lead. Because of its high lead content, the first metallic layer has a solidus temperature of at least 280° C., such that the first metallic layer does not melt during reflow of the near-eutectic solder layers, and maintains its shape at temperatures sufficient to cause localized mixing of the first metallic layer and the near-eutectic solder layers during the latter stages of the reflow process. In addition to promoting standoff, the high-lead intermediate region of the solder connection promotes stress relief during temperature excursions, thus improving the fatigue resistance of the solder connection during temperature cycling.

Other objects and advantages of this invention will be better appreciated from the following detailed description.

DESCRIPTION OF THE PREFERRED EMBODIMENT

Figure 2:
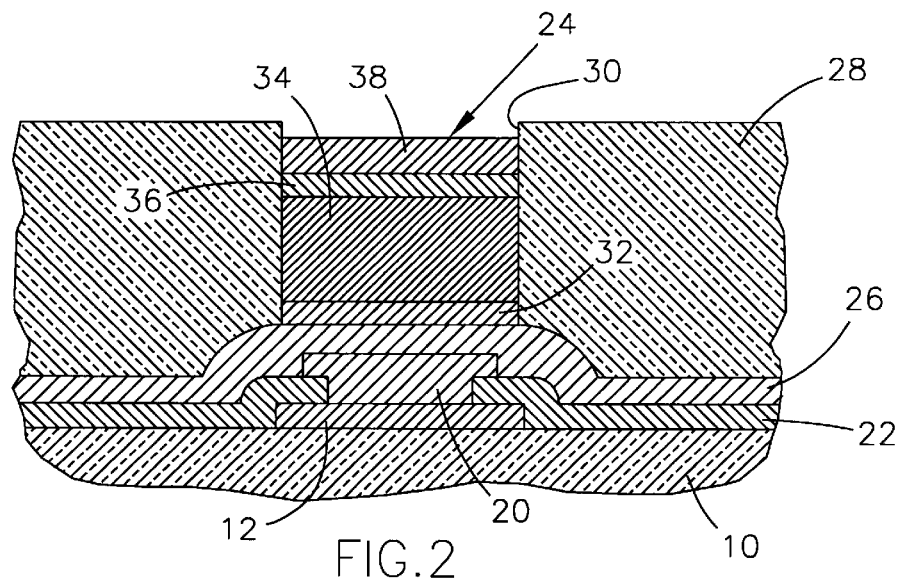
FIGS. 2 and 3 represent a multilayer metal bump and a solder bump connection with a graded composition in accordance with the present invention.
Figure 3:
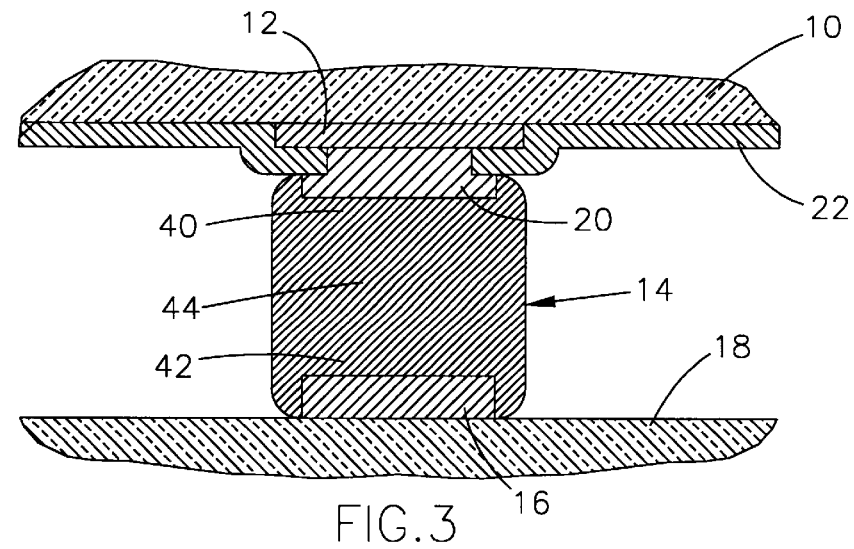

FIGS. 2 and 3 represent partial cross-sectional views of a semiconductor substrate 10 after solder bumping and solder reflow processes, respectively, have been completed in accordance with the present invention. In FIG. 2, the substrate 10 will typically be in the form of a wafer, while in FIG. 3 the substrate 10 is in the form of a flip chip or other surface-mount semiconductor circuit device following singulation of the wafer of FIG. 2. As illustrated in FIGS. 2 and 3, the surface of the substrate 10 is shown as being protected by a passivation layer 22 that protects the substrate 10 from environmental contaminants, moisture and electrical shorts. The passivation layer 22 is typically silicon dioxide, though silicon nitride, polyimides, phosphosilicated glass (PSG), borophosphosilicated glass (BPSG), and Dow Chemical's CYCLOTENE may also be used. A portion of an interconnect pad 12 is exposed by an opening in the passivation layer 22. The pad 12 can be conventionally formed of aluminum or an aluminum-base alloy, and is therefore generally unsolderable and susceptible to corrosion if left exposed. Covering the pad 12 is a UBM 20 that provides a solderable surface for a solder connection 14 (FIG. 3) formed by reflowing a multilayer metal bump 24 (FIG. 2) of this invention. The multilayer metal bump 24 is shown in FIG. 2 as being formed of different metallic layers within a via 30 formed in a plating mask 28. A first of these layers will be referred to as a first solder layer 32, which is shown as having been deposited on a plating seed layer 26 covering the UBM 20. On the first solder layer 32, the metal bump 24 includes what will be termed a noncollapsing layer 34, followed by a soluble layer 36 and a second solder layer 38. The bases for the use of these terms to describe the layers of the metal bump 24 will become apparent from the following discussion.

The UBM 20 can be omitted if the interconnect pad 12 were formed of a solderable material, e.g., copper, silver, gold, etc. As will become apparent, the UBM 20 need not be solderable if the noncollapsing layer 34 is formed of a metal such as silver, which will bond to a nonsolderable surface (e.g., an aluminum UBM 20 or pad 12) during reflow of the metal bump 24. The terms "solderable" and "unsolderable" are used herein to refer to the ability of a metal to form a metallurgical bond with a solder material. In a preferred embodiment, the multilayer metal bump 24 and solder connection 14 are based on a tin-lead solder alloy system. For expedience, the present invention will be described below in terms of the preferred tin-lead solder alloy system, though it will be apparent to those skilled in the art that the teachings of this invention are applicable to other solder alloy systems, including but not limited to tin and gold, tin and copper, and tin and silver, and that appropriate metals that are solderable and nonsolderable with respect to alternative alloy systems can and would be substituted for those identified below.

The UBM 20 can be a combination of thin films or a short bump either electroplated or formed of electroless nickel in accordance with prior art practices. In a preferred embodiment, the UBM 20 is formed to include an adhesion layer, a diffusion barrier layer, and a solderable layer (not shown). Suitable adhesion layer materials include aluminum, titanium, chromium and tungsten, which directly contact and metallurgically bond to the interconnect pad 12. Suitable solderable layer materials include copper and gold, while suitable materials for the diffusion barrier layer include nickel-vanadium, chromium-copper and palladium. The diffusion barrier layer is between the adhesion and solderable layers to reduce solid state diffusion between the UBM 20 and the solder connection 14 (FIG. 3) formed from the multilayer metal bump 24 (FIG. 2). Particularly suitable combinations for the adhesion, diffusion barrier and solderable layers of the UBM 20 are, respectively: aluminum, nickel-vanadium and copper; titanium, nickel-vanadium and copper; chromium, chromium-copper, copper and gold; titanium, palladium and gold; and titanium-tungsten, nickel-vanadium and copper. A suitable thickness for the UBM 20 is about one to about two micrometers, though greater and lesser thicknesses are possible. A minibump (not shown) could also be formed as part of the UBM 20, with the resulting UBM having a thickness of about ten to fifteen micrometers.

As a matter of processing convenience, the seed layer 26 is preferably deposited by a vacuum deposition process such as sputtering or evaporation to cover the entire surface of the wafer substrate 10. Suitable materials for the seed layer 26 include copper, silver and any other materials that can be easily plated with metal or metal alloys, such as the tin-lead alloys described below. As will be explained below, preferred materials for the seed layer 26 are soluble in solder alloys and form intermetallics with the metal present in the metal bump 24. At a minimum, the seed layer 26 must have good adhesion to the UBM 20 and noncollapsing layer 34, even if intermetallics are not formed. The purpose of the seed layer 26 is to facilitate the electrodeposition of the bump metals, and therefore is not needed if the metal layers 32, 34, 36 and 38 of the bump 24 are deposited by vacuum deposition, evaporation or sputtering, all of which are within the scope of this invention. Furthermore, the UBM 20 could serve as a plating seed layer if patterning the UBM 20 is postponed until after the bump 24 is formed. The upper layers of the UBM 20 could optionally be patterned before the bump 24 is formed, but with at least one layer left covering the entire wafer substrate 10 to serve as a plating seed conductor to the metals being deposited. The remaining layer(s) of the UBM 20 would then be patterned after the plating mask 28 is removed. With this process, the bump 24 would be exposed to etchants used to pattern the UBM 20, such that chemical compatibility would be necessary to allow the UBM 20 to be etched without damaging the bump metals.

The plating mask 28 is then applied to the wafer substrate 10, and the via 30 is defined in the mask 28 to expose a portion of the seed layer 26 over the UBM 20. The mask 28 is preferably formed of a photoimagable material that meets the feature definition and thickness requirements for the solder plating process chosen to deposit the remainder of the multilayer metal bump 24, and enables the metal bump 24 to have adequate height and volume to produce the desired solder connection 14. A suitable photoimagable material for this purpose is a positive photoresist available from Hoechst Celanese under the name AZP4620.

After the mask 28 has been imaged and the via 30 developed in accordance with known practices, the individual metal layers 32, 34, 36 and 38 of the multilayer metal bump 24 are electrodeposited onto the exposed portion of the seed layer 26, as seen in FIG. 2. The first solder layer 32 is first deposited to a thickness of about one micrometer on the seed layer 26. As will become apparent, the first solder layer 32 serves as an adhesion layer between the plating seed layer 26 and the subsequently deposited noncollapsing layer 34. Suitable plating processes and baths are known to those skilled in the art, and therefore will not be discussed in any detail here. The minimum thickness for the seed layer 26 is determined by its electrical resistance across the wafer substrate 10. The resistance must be sufficiently low so that the voltage drop due to the current going away from the current contact is low compared to the voltage drop between the plating solution and the surface of the wafer substrate 10. As a result, the entire wafer surface is substantially at the same potential so that the plated thickness will be uniform. In the present embodiment where the seed layer 26 is a discrete layer deposited on the UBM 20, the maximum thickness for the seed layer 26 is determined by how much of the seed layer 26 can be dissolved into the first solder layer 32 during reflow. Preferably, the thickness of the seed layer 26 is in the range of about 0.1 to about 0.4 micrometer, so that the entire seed layer 26 dissolves into the first solder layer 32 during reflow. If the seed layer 26 is not totally dissolved, then the adhesion of the seed layer 26 to the UBM 20 becomes critical to achieve adequate adhesion of the metal bump 24 to the UBM 20.

As can be seen from FIG. 2, the via 30 can have a different size and shape than the UBM 20 because the solder layer 32 is plated onto the seed layer 26, which completely covers the UBM 20. In the prior art, the size of the UBM 20 and resist thickness would have dictated the amount of solder that can be deposited by plating. In accordance with U.S. patent application Ser. No. 09/280,946, the presence of the seed layer 26 enables the amount of solder to be deposited, and therefore the size of the metal bump 24, to be free of the conventional limitations imposed by the UBM 20. As a result, the diameter of the metal bump 24 can be made larger or smaller, and/or of a different shape, than the UBM 20 to optimize the flow of underfill around the solder connection 14 (and between adjacent solder connections on the chip), and to optimize the mechanical and electrical properties of the solder connections 14.

Based on the tin-lead solder system being described in reference to FIGS. 2 and 3, the first solder layer 32 preferably has a composition near the 63Sn/37Pb eutectic alloy (melting point of 183° C.). Consequently, the near-eutectic solder alloy of the first solder layer 32 has physical and mechanical properties very similar to that of the eutectic alloy, but with a liquidus temperature between 183° C. and about 190° C. The first solder layer 32 is useful to improve the adhesion between the UBM 20 and the noncollapsing layer 34. Whether the first solder layer 32 is necessary will depend on the compositions chosen for the UBM 20, seed layer 26 and noncollapsing layer 34, and on the processes used for fabrication and assembly. It is foreseeable that certain combinations will not require use of the first solder layer 32, such that this layer 32 is considered optional when practicing the present invention.

After depositing the first solder layer 32, the noncollapsing layer 34 is electrodeposited. The noncollapsing layer 34 is termed "noncollapsing" to indicate that the layer 34 does not significantly collapse (melt and reflow) during the reflow operation subsequently performed to attach the substrate 10 to a second substrate 18, such as a circuit board. Based on the tin-lead solder system being described in reference to FIGS. 2 and 3, the noncollapsing layer 34 may be termed "noneutectic" in that it is formed of a tin-lead alloy that contains a significantly greater amount of lead than the 63Sn/37Pb eutectic alloy, and therefore has significantly different physical and mechanical properties. In a preferred embodiment, the composition of the noncollapsing layer 34 has a liquidus temperature of about 40° C. or higher than that of the near-eutectic alloy of the first solder layer 32, requiring a lead content of at least 80 weight percent in the present tin-lead alloy system. However, the noncollapsing layer 34 could be formed of silver or another metal or metal alloy outside the tin-lead alloy system, as long as its liquidus temperature is sufficiently higher than that of the first solder layer 32. As will be discussed below, the composition of the noncollapsing layer 34 is preferably capable of forming a graded transition with the second solder layer 38 toward the end of the reflow operation, after the soluble layer 36 has dissolved into the second solder layer 38. A suitable thickness for the noncollapsing layer 34 is about twenty to fifty micrometers.

Next deposited is the soluble layer 36, followed by the second solder layer 38. The soluble layer 36 may be copper, silver, gold or another metal that is soluble in the tin-lead solder system, and will dissolve completely at suitable reflow temperatures to form intermetallics with tin. Suitable thicknesses for the metal layer 36 will depend in part of the properties of the particular metal and the reflow profile used. As will be discussed further below, the metal bump 24 formed in accordance with this invention will not be perfectly coplanar with other metal bumps 24 on the eventual chip singulated from the wafer substrate 10. Similarly, the conductors 16 on the substrate 18 to which the chip is attached will not be perfectly coplanar with each other. For this reason, the soluble layer 36 is employed to enable the second solder layer 38 to remain molten for a sufficient length of time to insure that all metal bumps 24 collapse sufficiently to wet their corresponding conductors 16. The thickness of the soluble layer 36 will determine the length of time during which the second solder layer 38 remains molten. Thicker soluble layers 36 provide more time, though also require more time to dissolve into the solder layer 38. Eventually, total dissolution of the soluble layer 36 is desired, so that there are no metal interfaces within the solder connection 14 to act as stress risers or that provide sites to initiate fractures. In practice, a thickness of about 0.2 micrometer has been found suitable for the soluble layer 36.

The second solder layer 38 is the final layer of the multilayer metal bump 24 shown in FIG. 2. A suitable thickness for the second solder layer 38 is about twenty-five micrometers. In a preferred embodiment, the second solder layer 38 is formed of a near-eutectic tin-lead solder alloy, similar or identical to that of the first solder layer 32, so as to have a liquidus temperature of between 183° C. and about 190° C. The same process used to deposit the first solder layer 32 may be used to deposit the second solder layer 38, so that the properties of these layers 32 and 38 are the same.

After depositing the solder layers 32 and 38, the noncollapsing layer 34, and the soluble layer 36, the mask 28 and that portion of the seed layer 26 not covered by the metal bump 24 are removed. The seed layer 26 can be removed without damaging the metal bump 24 by oxidizing the seed layer 26 and then etching the resulting oxide. For example, a copper seed layer 26 can be oxidized and removed with a solution of about 1% hydrogen peroxide and about 1% sulfuric acid in water between room temperature and about 50° C. It is foreseeable that other etchants and processes could be used to remove the seed layer 26.

According to the present invention, the metal bump 24 is not reflowed prior to registration with its conductor 16 (FIG. 3), by which the substrate 10 (now singulated as a device chip 10) is placed on the substrate 18 so that the near-eutectic solder alloy 38 contacts the conductor 16. Instead, reflow is performed only after the device chip 10 has been properly placed on the substrate 18 so that each of its metal bumps (e.g., metal bump 24) is registered with a conductor (e.g., conductor 16) on the substrate 18. During reflow, the metal bump 24 is transformed to yield the columnar-shaped solder connection 14 shown in FIG. 3, which is attached to the device chip 10 only at the UBM 20.

During an initial reflow phase, generally within a temperature range of about 210° C. to about 240° C. (based on the tin-lead alloy system described), the solder layers 32 and 38 melt first as a result of their near-eutectic compositions. At this time, the solder layer 38 contacting the conductor 16 begins to dissolve the soluble layer 36, and the solder layer 32 nearest the UBM 20 dissolves the seed layer 26. Conductors on circuit boards are generally not coplanar due to fabrication variations. Therefore, when the device chip 10 is placed on the substrate 18 with its metal bumps 24 registered with the conductors 16, only a few metal bumps 24 will typically be in direct contact with their corresponding conductors 16. During the time the soluble layer 36 is dissolving into the second solder layer 38, the first and second solder layers 32 and 38 will remain molten and partially collapse, such that all bumps 24 are connected to their conductors 16. Without the soluble layer 36, the noncollapsing layer 34 might mix with the second solder layer 38, yielding an alloy with a higher melting point that immediately solidifies, thereby limiting the number of bumps 24 able to contact and bond to their conductors 16.

Once the soluble layer 36 is dissolved by the second solder layer 38, an end portion 42 of the solder connection 14 is formed that bonds the noncollapsing layer 34 to the conductor 16. The soluble layer 36 becomes a low level component of the end region 42, which contains tin intermetallics as a result of the compositions of the soluble layer 36 and solder layer 38 combining. The near-eutectic alloy of the second solder layer 38 also forms tin intermetallics with the conductor 16 if the latter is formed of copper, silver, etc. As with the soluble layer 36, the seed layer 26 becomes a low level component of a second end region 40 of the solder connection 14 because of the minimal thickness of the seed layer 26. Copper and silver are preferred materials for the seed layer 26 because each is soluble in tin-lead solder alloys and can serve to enhance certain properties of the solder connection 14. For example, copper and silver contents of up to about 1% and about 2%, respectively, in a tin-lead solder alloy can enhance resistance to electromigration, adhesion, and mechanical properties such as tensile strength and creep resistance. As a result of the above, the solder connection 14 is characterized by end portions 40 and 42 that contain tin intermetallics and bond the noncollapsing layer 34 to the conductor 16 and UBM 20.

As indicated above, a brief period of time is necessary to dissolve the soluble layer 36 into the second solder layer 38. According to the invention, the noncollapsing layer 34 does not melt while the soluble layer 36 is dissolving, and therefore does not mix with the near-eutectic alloys of solder layers 32 and 38 or the resulting end regions 40 and 42 of the solder connection 14 during this initial phase of reflow. Excessive mixing between these regions would have the undesirable effect of creating a solder alloy with an intermediate lead content within the end regions 40 and 42. Once formed, such an alloy would solidify during the initial reflow phase. The period of time afforded by the dissolution of the soluble layer 36 allows the device chip 10 to settle, so that all of the metal bumps 24 on the device chip 10 wet their respective conductors 16. The specific material and thickness of the soluble layer 36 are chosen so that the time for it to dissolve is sufficiently long for all the metal bumps 24 to bond to their conductors 16.

Thereafter, during additional time at the reflow temperature, limited portions of the noncollapsing layer 34 mix with the adjacent end regions 40 and 42 and, as lead diffuses into the end regions 40 and 42 from the noncollapsing layer 34, melt, creating a graded lead concentration through the solder connection 14. As a result, between the intermetallic regions immediately adjacent the conductor 16 and UBM 20, the lead content of the solder connection 14 is higher than eutectic (i.e., greater than 37 weight percent), with the lead concentration at an intermediate region 44 of the solder connection 14 being significantly higher than the lead concentrations at the end regions 40 and 42. The lead concentration within the solder connection 14 will vary with distance from the device chip 10 and the substrate 18, but the solder connection 14 will be free of any discrete interfaces between different metals or abrupt changes in lead concentration. In a preferred embodiment, the maximum lead concentration within the intermediate region 44 is the same as that of the noneutectic solder alloy 34, i.e., at least 80 weight percent, and the composition within the end regions 40 and 42 remains near eutectic.

Figure 1:
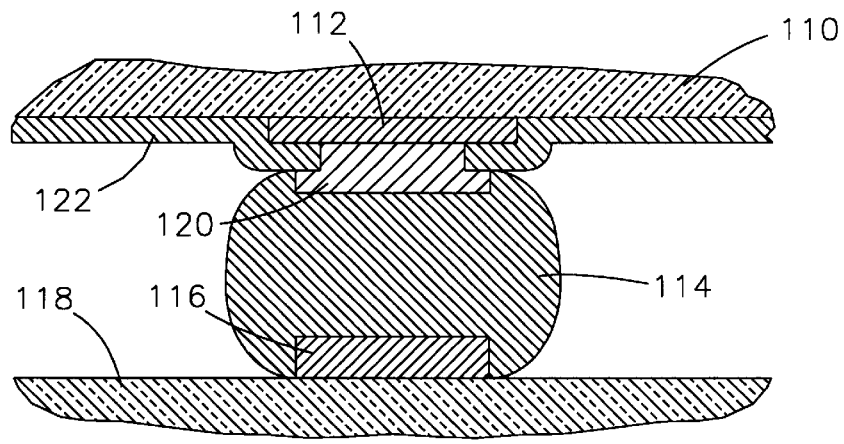
FIG. 1 is a cross-sectional side view of a solder bump connection in accordance with the prior art.

As indicated above, when performed at appropriate reflow temperatures and durations, the intermediate region 44 does not melt and collapse at any time during reflow as a result of its high lead concentration. Based on a maximum lead content of at least 80 weight percent in the intermediate region 44, a suitable maximum temperature during reflow is about 210° C. to about 240° C. when maintained for durations of up to about 30 seconds. Because the intermediate region 44 does not collapse during reflow, the surface tension of the molten solder in the end regions 40 and 42 is prevented from drawing the device chip 10 excessively close to the substrate 18, so that the original standoff established by the metal bump 24 is more nearly preserved, providing a sufficient gap between the chip 10 and substrate 18 to allow cleaning solutions and an underfill material (not shown) to penetrate the gap. In addition, the standoff and higher lead content of the solder connection 14 also improves stress relief during thermal cycles. Another benefit of this invention is that the solder connection 14 does not take on a spherical shape (e.g., FIG. 1), whose greater width could increase the occurrence of shorting between adjacent connections and restrict the flow of underfill material.

The substrate 18 depicted in FIG. 3 may be a circuit board or an interposer substrate that is then assembled to a circuit board. If the latter, the high-lead intermediate region 44 preferably has a lead content of 95 weight percent or more, resulting in a solidus temperature of above 300° C. Reflow soldering the chip 10 to the interposer substrate 18 would be performed at a temperature near or just above the process temperature for the parent circuit board, but below 300° C. Reflow soldering the interposer substrate 18 to a circuit board would then be performed with a solder alloy having a lower melting temperature, e.g., below the solidus temperature of the mixed regions 40 and 42 of the solder connection 14, without disturbing the solder connections 14 between the chip 10 and interposer substrate 18.

While the invention has been described in terms of a preferred embodiment, it is apparent that other forms could be adopted by one skilled in the art. A notable example is to form the noncollapsing layer 34 of silver, and the second solder layer 38 of tin. In this embodiment, the UBM 20 would not need to be formed of a solderable material, and the noncollapsing layer 34 and the second solder layer 38 would form a low MP solder (within the end region 42) to join the noncollapsing layer 34 to the conductor 16 during reflow. Other metal combinations are foreseeable with the invention. Accordingly, the scope of the invention is to be limited only by the following claims.

What is claimed is:

1. A method of electrically and mechanically connecting a circuit component to a conductor on a substrate, the method comprising the steps of:

provide an interconnect surface on a surface of the component;

forming a mask having a via that exposes a portion of the interconnect surface;

depositing a first metallic layer within the via;

depositing a second metallic layer on the first metallic layer; and then depositing a first solder layer on the second metallic layer, the first solder layer having a liquidus temperature;

wherein the first metallic layer has a sufficiently high liquidus temperature so as not to melt or deform at the liquidus temperature of the first solder layer, and the second metallic layer comprises at least one metal that is soluble in the first solder layer.

2. A method according to claim 1, wherein the first metallic layer is deposited to be thicker than the first solder layer.

3. A method according to claim 1, wherein the liquidus temperature of the first metallic layer is at least 40° C. higher than the liquidus temperature of the first solder layer.

4. A method according to claim 1, wherein the second metallic layer is soluble in the first solder layer.

5. A method according to claim 1, further comprising the steps of:

forming the interconnect surface to have a plating seed surface layer; and after forming the mask, depositing a second solder layer on the plating seed surface layer within the via, the first metallic layer being then deposited on the second solder layer.

6. A method according to claim 5, wherein the plating seed surface layer consists essentially of a metal that is soluble in the second solder layer.

7. A method according to claim 5, wherein the second solder layer has a liquidus temperature at which the first metallic layer does not melt or deform.

8. A method according to claim 1, wherein the first solder layer and the first metallic layer are formed of tin-lead alloys, the first metallic layer having a lead content of at least 80 weight percent.

9. A method according to claim 8, wherein the at least one metal of the second metallic layer forms an intermetallic with tin.

10. A method according to claim 1, wherein the circuit component is a flip chip.

11. A method according to claim 1, wherein the interconnect surface comprises an interconnect pad and a solderable layer on the interconnect pad, the circuit component further comprising a passivation layer on the surface thereof, the passivation layer having an opening therein that exposes a portion of the interconnect pad, the solderable layer overlaying and contacting the portion of the interconnect pad exposed by the opening in the passivation layer.

12. A method according to claim 1, further comprising the steps of:

removing the mask;

registering the first solder layer with the conductor;

heating the circuit component and substrate to melt the first solder layer and dissolve the second metallic layer into the first solder layer;

further heating the circuit component and substrate to cause limited mixing of the first metallic layer with the first solder layer; and then cooling to form a graded solder connection that electrically and mechanically connects the circuit component to the conductor, the graded solder connection having a first end region adjacent the interconnect pad, a second end region contacting the conductor, and an intermediate region between the first and second end regions, the intermediate region containing a metal composition that differs from the second end region and has a higher liquidus temperature than the second end region, the graded solder connection being free of discrete interfaces between the intermediate region and the first and second end regions.

13. A method according to claim 12, wherein the intermediate region has a liquidus temperature at least 40° C. higher than the second end region.

14. A method according to claim 12, further comprising intermetallics in the second end region.

15. A method according to claim 12, wherein the metal composition of the intermediate region differs from the first end region and has a higher liquidus temperature than the first end region.

16. A method according to claim 12, wherein the intermediate region and the first and second end regions contain alloys of first and second metals, the graded solder connection having a maximum content of the first metal in the intermediate region and having a decreasing content of the first metal and an increasing content of the second metal toward the second end region.

17. A method according to claim 16, wherein the graded solder connection has a decreasing content of the first metal and an increasing content of the second metal toward the first end region.

18. A method according to claim 17, wherein the first end region contains intermetallics of the second metal.

19. A method according to claim 16, wherein the second end region contains intermetallics of the second metal.

20. A method according to claim 16, wherein the first metal is lead and the second metal is tin, and the intermediate region contains at least 80 weight percent lead with the balance consisting essentially of tin.

21. A method according to claim 12, wherein the circuit component is a flip chip.

* * * * *